(12) United States Patent
Semenov et al.

(10) Patent No.: US 10,024,909 B2
(45) Date of Patent: Jul. 17, 2018

(54) MULTI-BIT DATA FLIP-FLOP WITH SCAN INITIALIZATION

(71) Applicant: Freescale Semiconductor, Inc., Austin, TX (US)

(72) Inventors: Mikhail Yurievich Semenov, Moscow (RU); Alexander Ivanovich Kornilov, Moscow (RU); Victor Mikhailovich Mikhailov, Mosco (RU); Denis Borisovich Malashevich, Moscow (RU); Viacheslav Sergeyevich Kalashnikov, Moscow (RU)

(73) Assignee: NXP USA, INC., Austin, TX (US)

( * ) Notice: Subject to any disclaimer, the term of this patent is extended or adjusted under 35 U.S.C. 154(b) by 47 days.

(21) Appl. No.: 15/299,551

(22) Filed: Oct. 21, 2016

(65) Prior Publication Data
US 2017/0292995 A1    Oct. 12, 2017

(30) Foreign Application Priority Data
Apr. 11, 2016   (RU) ................................ 2016113683

(51) Int. Cl.
*H03K 3/02*   (2006.01)
*G01R 31/317*   (2006.01)
*H03K 3/3562*   (2006.01)

(52) U.S. Cl.
CPC ... *G01R 31/31701* (2013.01); *H03K 3/35625* (2013.01)

(58) Field of Classification Search
CPC ................. G01R 31/31701; H03K 3/35625
USPC .......... 327/198, 202, 218, 239, 203, 199; 714/726, 727, 731, 738, 728, 732
See application file for complete search history.

(56) References Cited

U.S. PATENT DOCUMENTS

| | | | |
|---|---|---|---|
| 5,130,568 A | 7/1992 | Miller et al. | |
| 5,359,636 A | 10/1994 | Aoyama | |
| 6,446,229 B1 | 9/2002 | Merrick et al. | |
| 6,680,622 B2 | 1/2004 | Zounes | |
| 7,469,372 B2 | 12/2008 | Nardini et al. | |
| 7,696,801 B2 | 4/2010 | Yeh et al. | |
| 9,009,552 B2 | 4/2015 | Kwan et al. | |
| 9,300,275 B1 | 3/2016 | Kumar et al. | |
| 2006/0085709 A1* | 4/2006 | Kim ................ | G01R 31/31854 714/726 |
| 2007/0001729 A1 | 1/2007 | Branch et al. | |
| 2011/0239069 A1* | 9/2011 | Ramaraju ........... | G06F 11/267 714/731 |

(Continued)

*Primary Examiner* — Thomas Skibinski (57) ABSTRACT

Multi-bit data flip-flops are disclosed that provide bit initialization through propagation of scan bits. Input multiplexers are configured to select between input data bits and input scan bits based upon mode select signals. Master latches receive and latch outputs from the input multiplexers. Slave latches receive and latch outputs from the master latches and also provide propagated input scan bits to the input multiplexers. A first state for the mode select signals selects the input data bits for a data mode of operation, and a second state for the mode select signals selects the input scan bits for a scan mode of operation. Further, the input multiplexers, master latches, and slave latches are configured to operate in an initialization mode to pass a fixed input scan bit through the multi-bit data flip-flop based upon initialization signals (e.g., set and/or reset signals).

17 Claims, 8 Drawing Sheets

(56) References Cited

U.S. PATENT DOCUMENTS

2012/0062283 A1\* 3/2012 Kwan ............. G01R 31/31857
327/143

\* cited by examiner

MULTI-BIT DATA FLIP-FLOP WITH SCAN INITIALIZATION

RELATED APPLICATIONS

This application claims priority under 35 USC § 119 to Russian Patent Application No. 2016113683 filed on Apr. 11, 2016, and entitled "MULTI-BIT DATA FLIP-FLOP WITH SCAN INITIALIZATION," which application is hereby incorporated by reference in its entirety.

TECHNICAL FIELD

This technical field relates to multi-bit data flip-flops.

BACKGROUND

Multi-bit data flip-flops are often used within integrated circuit devices to save power and area in comparison with stand-alone single bit data flip-flops for the same number of bits. For existing multi-bit data flip-flop solutions, every flip-flop bit is typically implemented using a master latch and a slave latch. For some integrated circuit embodiments, multi-bit data flip-flops are also serially connected to provide an internal scan chain. To implement this internal scan chain, each flip-flop bit also typically includes an input multiplexer that selects between a data bit input and a scan bit input. For initialization of each flip-flop bit, additional transistors or control gates are included within the master and slave latches to provide set and reset capabilities. These additional set/reset transistors or gates, however, add to the die area required for the multi-bit data flip-flop circuitry within the integrated circuit device.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Multi-bit data flip-flop embodiments are disclosed that provide bit initialization through propagation of scan bits through the multi-bit data flip-flop. Input multiplexers are configured to select between input data bits and input scan bits based upon mode select signals. Master latches receive and latch outputs from the input multiplexers. Slave latches receive and latch outputs from the master latches and also provide propagated input scan bits to the input multiplexers. A first state for the mode select signals applied to the input multiplexers selects the input data bits for a data mode of operation, and a second state for the mode select signals applied to the input multiplexers selects the input scan bits for a scan mode of operation. Further, the input multiplexers, master latches, and slave latches are configured to operate in an initialization mode to pass a fixed input scan bit through the multi-bit data flip-flop based upon assertion of one or more initialization signals (e.g., set and/or reset signals). For the initialization mode of operation, a first bit stage receives input scan bit that is received by the multi-bit data flip-flop, additional bit stages receive the output of prior bit stages and provide a propagated scan bit to next bit stages, and a last bit stage receives the output of prior bit stages without further propagating a scan bit to a next bit stage. As such, the bit stages can be initialized using the input scan bit received by the multi-bit data flip-flop without requiring additional set/reset transistors or gates within the input multiplexers, master latches, or slave latches. Different features and variations can be implemented, as desired, and related or modified systems and methods can be utilized, as well.

In contrast with prior multi-bit data flip-flop solutions that rely upon separate set/reset circuitry within master/slave latches, therefore, the multi-bit data flip-flop embodiments described herein provide initialization through an internal scan chain and related multiplexers for the flip-flop bits. Rather than rely upon such additional set/reset transistors for initialization of the master latches and slave latches for the flip-flop bits, the internal scan initialization of the disclosed embodiments instead relies upon sequential propagation of a fixed input scan bit through the master and slave latches along with their respective input multiplexers. The internal scan chain embodiments described herein for initialization of multi-bit data flip-flops reduce the number of transistors or gates as compared to prior solutions and thereby provide efficient solutions that save area within resulting integrated circuit device. Further, the internal scan initialization embodiments can also be configured such that they are insensitive to input clock signals and do not require switching during initialization thereby reducing power usage during initialization. Other advantages can also be achieved while taking advantage of the scan initialization techniques described herein.

Figure 1:
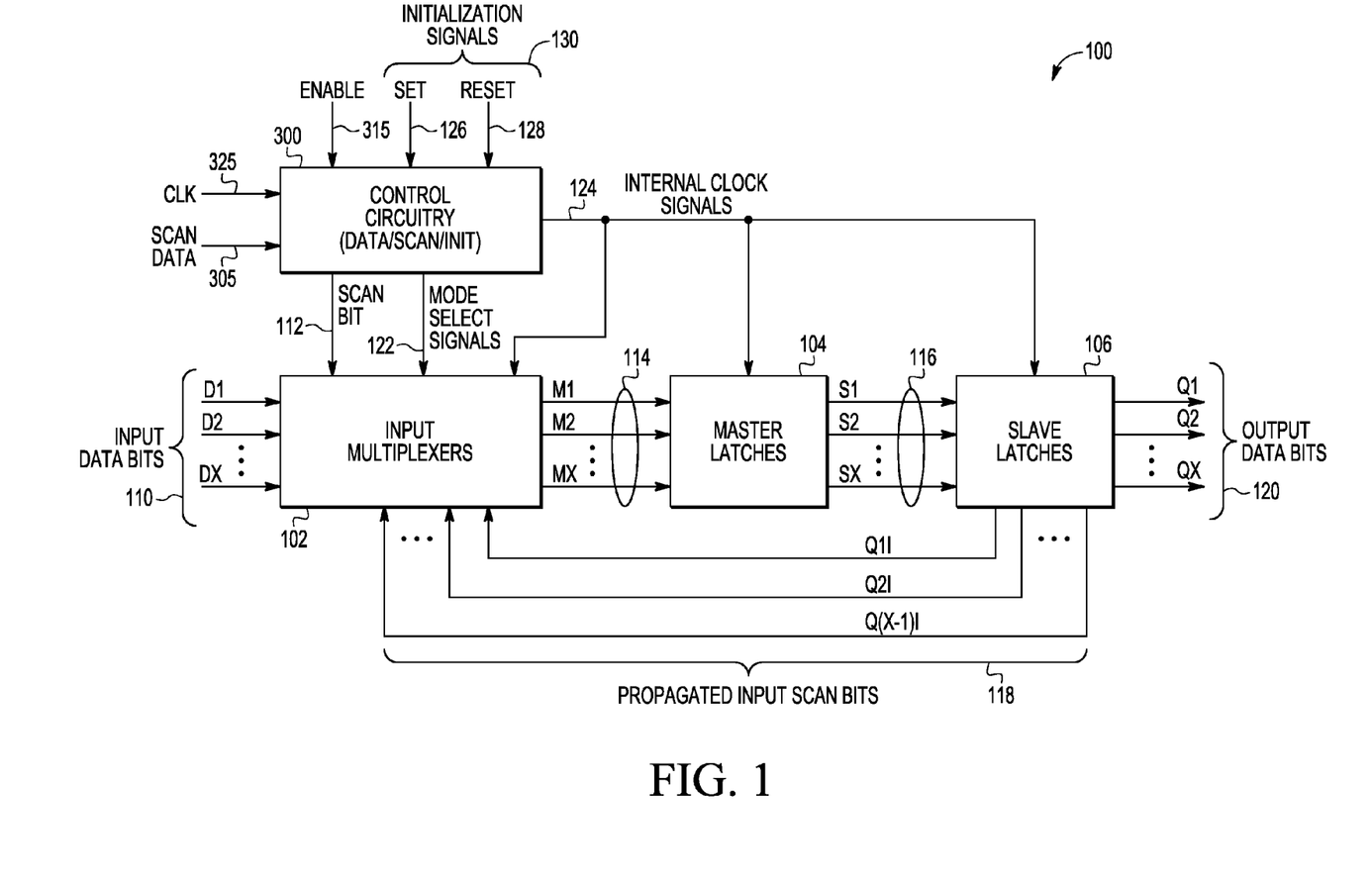
FIG. 1 is a block diagram of an example embodiment for a multi-bit data flip-flop that utilizes input scan bits and propagated input scan bits through input multiplexers to provide an internal scan initialization of master latches and slave latches for multiple output data bits.

FIG. 1 is a block diagram of an example embodiment 100 for a multi-bit data flip-flop that utilizes input scan bit 112 and propagated input scan bits 118 through input multiplexers 102 to provide an internal scan initialization of master latches 104 and slave latches 106 for multiple (X) output data bits 120. The input multiplexers 102 select between input scan bit 112/118 or input data bits (D1, D2, . . . DX) 110 based upon one state for the mode select signals 122. For a data mode of operation, the input multiplexers 102 select the input data bits 110 to output as the multiplexer output bits (M1, M2, . . . MX) 114 based upon one state of the mode select signals 122. For a scan mode of operation, input multiplexers 102 select the input scan bits 112/118 to output as the multiplexer output bits (M1, M2, . . . MX) 114 based upon a different state for the mode select signals 122. These multiplexer output bits 114 are received and latched by the master latches 104 which in turn provide master output bits 116. These master output bits 116 are received and latched by the slave latches 106 which in turn provide the output data bits (Q1, Q2, . . . QX) 120 for the multi-bit data flip-flop. As described further below, an inverted version of the output data bits for all except the last output data bit are also provided as the propagated input scan bits (Q1I, Q2I, . . . Q(X−1)I) 118 to the input multiplexers 102. These propagated input scan bits 118 allow for the input scan bit 112 to be propagated through the input multiplexers 102 to the master/slave latches 104/106. For the scan initialization mode, the input scan bit 112 has a fixed logic state and is propagated through the input multiplexers 102, the master latches 104, and the slave latches 106 in a transparent pass through configuration so that each bit of the multi-bit data flip-flop 100 is initialized to the fixed logic state.

Figure 3:
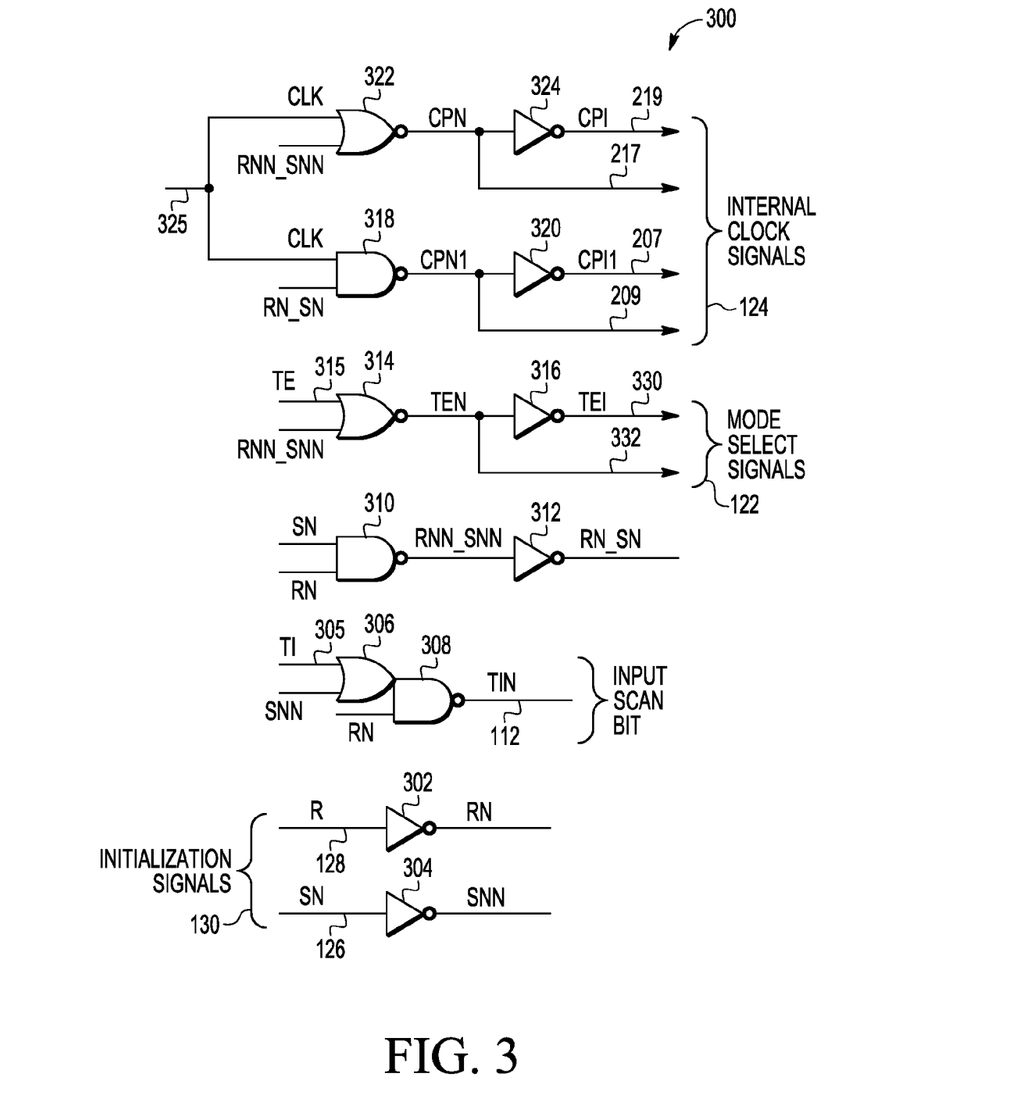
FIG. 3 is a circuit diagram of an example embodiment for control circuitry that can be used to generate internal clock signals, mode select signals, and input scan bits as well as other control or data signals.

The control circuitry 300, which is described in more detail with respect to FIG. 3, is configured to provide the data mode of operation, the scan mode of operation, and the scan initialization mode of operation for the multi-bit data flip-flop 100. The control circuitry 300 receives as inputs a clock (CLK) signal 325, scan data 305, an enable signal 315, a set signal 126, and a reset signal 128. The set signal 126 and the reset signal 128 are initialization signals 130 for the embodiment 100. The control circuitry 300 outputs the scan bit 112 as an input to the input multiplexers 102. The control circuitry 300 also outputs mode select signals 122 to the input multiplexers 102 and internal clock signals 124 to the input multiplexers 102, the master latches 104, and the slave latches 106.

Figure 2:
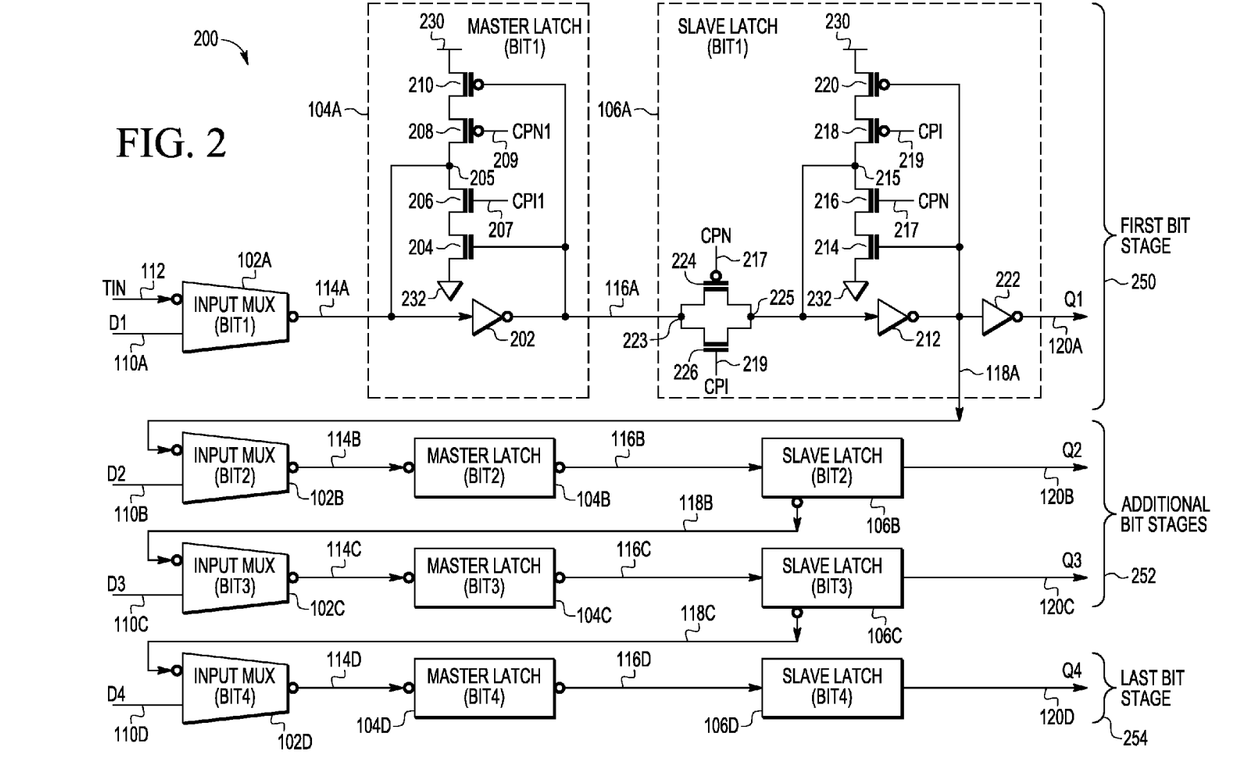
FIG. 2 is a circuit diagram of an example embodiment for a four-bit data flip-flop that utilizes input scan bits and input multiplexers to provide an internal scan initialization of master latches and slave latches for four output data bits.

FIG. 2 is a circuit diagram of an example embodiment for a four-bit data flip-flop 200 that utilizes input scan bit 112 and input multiplexers (MUXs) 102A-D to provide an internal scan initialization of master latches 104A-D and slave latches 106A-D for four output data bits 120A-D. Example circuit embodiments for the master latches 104A-D and the slave latches 106A-D are represented by the circuitry shown for master latch 104A and slave latch 106A, respectively. These circuit embodiments are described in more detail below. For the embodiment 200, a first bit stage 250 includes input multiplexer 102A, master latch 104A, and slave latch 106A. Additional bit stages 252 include a second bit stage with input multiplexer 102B, master latch 104B, and slave latch 106B as well as a third bit stage with input multiplexer 102C, master latch 104C, and slave latch 106C. A last bit stage 254 includes input multiplexer 102D, master latch 104D, and slave latch 106D. Example circuit embodiments for the input multiplexers 102A-D are described in more detail with respect to FIGS. 4-5 below.

Looking to the first bit stage 250, the input multiplexer 102A for the first bit (BIT1) receives a first input data bit (D1) 110A and the input scan bit (TIN) 112, which can be received as a series of input scan bits. The input scan bit (TIN) 112 is received as an inverted input. The output 114A from the first input multiplexer 102A is inverted and is received by the master latch 104A for the first bit. The output 116A for the first master latch 104A is also inverted and is received by the slave latch 106A for the first bit. The output of the slave latch 106A provides the first output data bit (Q1) 120A, and an inverted version of this output data bit 120A is provided as a propagated input scan bit 118A to the input multiplexer 102B for the second bit (BIT2).

Looking to the second bit stage, the input multiplexer 102B for the second bit (BIT2) receives a second input data bit (D2) 110B along with the propagated input scan bit 118A output by the slave latch 106A. The output 114B from the second input multiplexer 102B is inverted and is received by the master latch 104B for the second bit. The output 116B for the second master latch 104B is also inverted and is received by the slave latch 106B for the second bit. The output of the slave latch 106B provides the second output data bit (Q2) 120B, and an inverted version of this output data bit 120B is provided as a propagated input scan bit 118B to the input multiplexer 102C for the third bit (BIT3).

Looking to the third bit stage, the input multiplexer 102C for the third bit (BIT3) receives a third input data bit (D3) 110C along with the propagated input scan bit 118B output by the slave latch 106B. The output 114C from the third input multiplexer 102C is inverted and is received by the master latch 104C for the third bit. The output 116C for the third master latch 104C is also inverted and is received by the slave latch 106C for the third bit. The output of the slave latch 106C provides the third output data bit (Q3) 120C, and an inverted version of this output data bit 120C is provided as a propagated input scan bit 118C to the input multiplexer 102D for the fourth bit (BIT4).

Looking to the fourth bit stage, the input multiplexer 102D for the fourth bit (BIT4) receives a fourth input data bit (D4) 110D along with the propagated input scan bit 118C output by the slave latch 106C. The output 114D from the fourth input multiplexer 102D is inverted and is received by the master latch 104D for the fourth bit. The output 116D for the fourth master latch 104D is also inverted and is received by the slave latch 106D for the fourth bit. The output of the slave latch 106D provides the fourth output data bit (Q4) 120D.

Looking to the example circuit embodiment for the master latch 104A, the master latch 104A includes an inverter latch formed a first inverter 202 and a second inverter effectively formed by PMOS (p-type metal oxide semiconductor) transistor 210 and NMOS (n-type metal oxide semiconductor) transistor 204. The master latch 104A also includes timing transistors 206/208 that receive first clock signals 207/209. The source and drain for PMOS transistor 210 are connected between a supply voltage 230 and node 205 through the source and drain for PMOS transistor 208. PMOS transistor 210 receives the output of inverter 202 as the input to its gate, and PMOS transistor 208 receives a non-inverted first clock signal (CPN1) at its gate. The source and drain for NMOS transistor 204 are connected between ground 232 and node 205 through the source and drain for NMOS transistor 206. NMOS transistor 204 receives the output of inverter 202 as the input to its gate, and NMOS transistor 206 receives an inverted first clock signal (CPI1) at its gate. It is again noted that the example circuit embodiment shown for the master latch 104A can also be used for the other master latches 104B, 104C, and 104D.

In operation, the output 114A from the multiplexer 102A is received by inverter 202, and the inverted output of inverter 202 is received at the gates of transistors 204/210. Timing transistors 206/208 operate as switches and are turned "on" or "off" by the clock signals 207/209. When the timing transistors 206/208 are "on," transistors 204/210 operate as an inverter to output a logic level on node 205 that is the opposite of the logic level output by inverter 202. Node 205 is also coupled to the input of inverter 202. As such, when transistors 204/210 are operating as an inverter and coupled to node 205 through transistors 206/208, the inverter 202 and the transistors 204/210 operate to latch the voltage logic level for the output 114A within the master latch 104A. As described with respect to FIG. 3 below, when the set signal 128 or the reset signal 126 are active, the clock signals 207/209 are forced into states to place timing transistors 206/208 in their "off" condition, and the output of input multiplexer 114A is passed to the slave latch 106A through inverter 202.

Looking to the example circuit embodiment for the slave latch 106A, the slave latch 106A includes an inverter latch formed by a first inverter 212 and a second inverter effectively formed by PMOS transistor 220 and NMOS transistor 214. The slave latch 106A also includes timing transistors 216/218 that receive clock signals 217/219. The source and drain for PMOS transistor 220 are connected between a supply voltage 230 and node 215 through the source and drain for PMOS transistor 218. PMOS transistor 220 receives the output of inverter 212 as the input to its gate, and PMOS transistor 218 receives a non-inverted clock signal (CPN) at its gate. The source and drain for NMOS transistor 214 are connected between ground 232 and node 205 through the source and drain for NMOS transistor 216. NMOS transistor 214 receives the output of inverter 202 as the input to its gate, and NMOS transistor 216 receives an inverted clock signal (CPI) at its gate. It is again noted that the example circuit embodiment shown for the slave latch 106A can also be used for the other slave latches 106B, 106C, and 106D, although slave latch 106D does not provide a scan data bit output from its respective inverter 212 to an additional bit stage.

Slave latch 106A also includes pass gate transistors 224/226 and an additional inverter 222. Inverter 222 receives the output of inverter 212 and outputs the first data bit (Q1) 120A. The PMOS pass gate transistor 224 has its gate connected to the non-inverted clock signal (CPN) 217 and has its source and drain connected between nodes 223 and 225. The NMOS pass gate transistor 226 has its gate connected to the inverted clock signal (CPI) 219 and has its source and drain connected between nodes 223 and 225. Node 225 is connected to the input of inverter 212.

In operation, the pass gate transistors 224/226 operate to pass the output 116A of master latch 104A to the inverter 212 if they are "on" and to inhibit output 116A from reaching inverter 212 if they are "off," as determined by the clock signals 217/219. The output 116A from the master latch 104A, therefore, is received by inverter 212 if the pass gate transistors 224/226 are "on," and the inverted output of inverter 212 is received at the gates of transistors 214/220. This inverted output of inverter 212 is also provided as the propagated input scan data bit 118A to the input multiplexer 102B for the second bit (BIT2). Timing transistors 216/218 operate as switches and are turned "on" or "off" by the clock signals 207/209. When the timing transistors 216/218 are "on," transistors 214/220 operate as an inverter to output a logic level on node 215 that is the opposite of the logic level output by inverter 212. Node 215 is also coupled to the input of inverter 212. As such, when transistors 214/220 are operating as an inverter and coupled to node 215 through transistors 216/218, the inverter 212 and the transistors 214/220 operate to latch the voltage logic level for the output 116A within the slave latch 106A. As described with respect to FIG. 3 below, when the set signal 128 or the reset signal 126 are active, the clock signals 217/219 are forced into states to place timing transistors 216/218 in their "off" condition and to place pass gate transistors 224/226 in their "on" condition. As such, the output of master latch 104A is passed through pass gate transistors 224/226, inverter 212, and inverter 222 to provide outputs 118A and 120A.

FIG. 3 is a circuit diagram of an example embodiment control circuitry 300 that can be used to generate internal clock signals 124, mode select signals 122, and input scan bit 112 as well as other control signals. Reset signal (R) 128 and set signal (SN) 126 are received by inverters 302 and 304, respectively, to generate inverted versions of these signals (RN, SNN). The OR gate 306 receives input scan data (TI) 305 (e.g., received as a string of bits by the multi-bit data flip-flop) and the inverted set signal (SNN), and the output of OR gate 306 is provided as an input to NAND gate 308. NAND gate 308 also receives the inverted reset signal (RN) as an input, and the output of NAND gate 308 is the input scan bit (TIN) 112.

NAND gate 310 receives the set signal (SN) 126 and the inverted reset signal (RN) as an input, and the output of NAND gate 310 (RNN_SNN) is provided to inverter 312 which outputs an inverted version of that signal (RN_SN). The NOR gate 314 receives the output (RNN_SNN) from NAND gate 310 and an initial mode select signal (TE) 315. The output of NOR gate 314 provides non-inverted mode signal (TEN) 332 which is also passed through inverter 316 to provided inverted mode signal (TEI) 330. The NAND gate 318 receives the output (RN_SN) from inverter 312 and clock signal 325. The output of NAND gate 318 provides the first non-inverted clock signal (CPN1) 219 which is also passed through inverter 320 to provide the first inverted clock signal (CPI1) 217. The NOR gate 322 receives the output (RNN_SNN) from NAND gate 310 and clock signal 325. The output of NOR gate 322 provides the non-inverted clock signal (CPN) 217 which is also passed through inverter 324 to provide the inverted clock signal (CPI) 219. The input scan bit (TIN) 112, the mode select signals 122, and the clock signals 124 are provided to the input multiplexers 102A-D described further in FIGS. 4-5 below.

For the embodiment 300, the set signal (SN) 128 is active in a low logic level, and the reset signal (R) is active in a high logic level. As indicated above, when the set signal (SN) 128 or the reset signal (R) 126 are active, the clock signals 207/209 are forced into states to place timing transistors 206/208 in their "off" condition. In addition, and the clock signals 217/219 are forced into states to place timing transistors 216/218 in their "off" condition and to place pass gate transistors 224/226 in their "on" condition. In particular, TABLE 1 below provides example logic states for various signals for embodiment 300 when the set signal (SN) 128 and/or the reset signal (R) are active in initialization (INIT) modes and inactive in data mode and scan mode. It is noted that for TABLE 1, high logic states are represented by a logic "1", low logic states are represented by a logic "0", and states that do not affect the resulting values are shown as an "x".

TABLE 1

EXAMPLE FIXED LOGIC STATES FOR SET/RESET
OPERATION OF EMBODIMENT 300

| INIT MODE | R 128 | SN 126 | TI 305 | TIN 112 | TE 315 | TEI 330 | TEN 332 | CLK 325 | CPN 217 | CPI 219 | CPN1 209 | CPI1 207 |
|---|---|---|---|---|---|---|---|---|---|---|---|---|
| Reset | 1 | x | x | 1 | x | 1 | 0 | x | 0 | 1 | 1 | 0 |
| Set | 0 | 0 | x | 0 | x | 1 | 0 | x | 0 | 1 | 1 | 0 |

As shown in TABLE 1 for embodiment 300, when the reset signal (R) 128 is active and set to a logic "1", this forces the input scan bit (TIN) 112 to a logic "1," and changes to the input scan data (TI) 305 so not change the input scan bit (TIN) 112. The mode select signals 122 are also fixed to select scan mode such that the inverted mode signal (TEI) 330 is forced to a logic "1" and the non-inverted mode signal (TEN) is forced to a logic "0". Further, the internal clocks signals 124 are also fixed to cause the input scan bit (TIN) 112 to pass through the input multiplexers 102 and master/slave latches 104/106 without being responsive to the input clock signal (CLK) 325. In particular, clocks signals 207/217 are set to logic "0" and clocks signals 209/219 are set to logic "1." Because the input scan bit (TIN) 112 is a logic "1", the bits stages for the multi-bit data flip-flop are all set to logic "0" when reset (R) 128 is active. It is further noted that for embodiment 300, the set signal (SN) 126 does not affect the resulting logic values when reset signal (R) 128 is active.

As shown in TABLE 1 for embodiment 300, when the set signal (SN) 126 is active and set to a logic "0" while the reset signal (R) is inactive, this forces the input scan bit (TIN) 112 to a logic "0," and changes to the input scan data (TI) 305 so not change the input scan bit (TIN) 112. The mode select signals 122 are also fixed to select scan mode such that the inverted mode signal (TEI) 330 is forced to a logic "1" and the non-inverted mode signal (TEN) is forced to a logic "0". Further, the internal clocks signals 124 are also fixed to cause the input scan bit (TIN) 112 to pass through the input multiplexers 102 and master/slave latches 104/106 without being responsive to the input clock signal (CLK) 325. In particular, clocks signals 207/217 are set to logic "0" and clocks signals 209/219 are set to logic "1." Because the input scan bit (TIN) 112 is a logic "0", the bits stages for the multi-bit data flip-flop are all set to logic "1" when set (SN) 126 is active.

Figure 4:
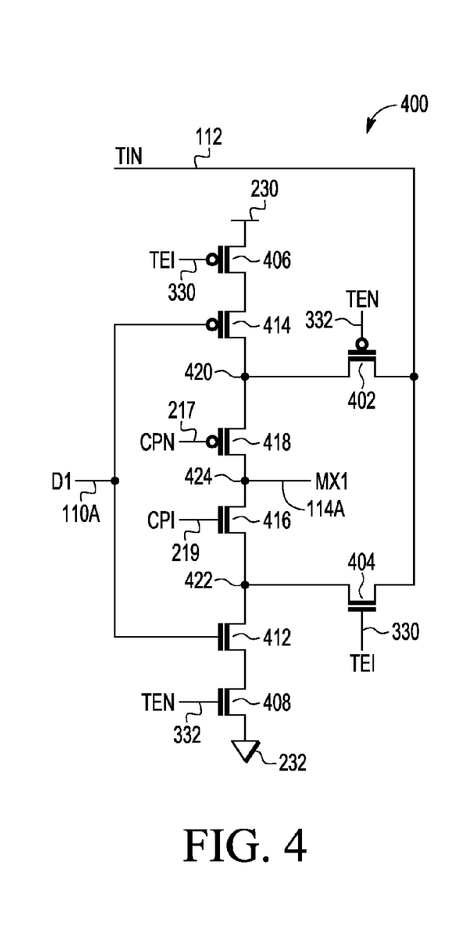
FIG. 4 is a circuit diagram of an example embodiment for the input multiplexers that include pass gates for input scan bits.

FIG. 4 is a circuit diagram of an example embodiment 400 for the input multiplexer 102A. The drain and source of PMOS transistor 414 are connected between node 420 and the voltage supply 230 through the drain and source of transistor 406, which receives the TEI signal 330 at its gate. Node 420 is connected to node 424 through the drain and source of PMOS transistor 418, which receives the CPI signal 219 at its gate. Node 424 provides the multiplexer output (MX1) 114A. The drain and source of NMOS transistor 412 are connected between node 422 and ground 232 through the drain and source of transistor 408, which receives the TEN signal 332 at its gate. Node 422 is connected to node 424 through the drain and source of NMOS transistor 416, which receives the CPN signal 217 at its gate. The input data bit (D1) 110A is connected to the gates of transistors 412 and 414. The input scan bit (TIN) 112 is connected to node 420 through PMOS transistor 402, which receives the TEN signal 332 at its gate. The input scan bit (TIN) 112 is connected to node 422 through NMOS transistor 404, which receives the TEI signal 330 at its gate.

When embodiment 400 is used for the input multiplexers in additional bit stages 252 or the last bit stage 254, the input scan bit (TIN) 112 becomes one of the propagated input scan bits 118 as shown in FIGS. 1 and 2.

In operation, the mode signals 330/332, which are inverted versions of each other as shown in FIG. 3, control transistors 402, 404, 406, and 408 to select between the input scan bit (TIN) 112 and an inverted version of the input data bit (D1) 110A to provide as an output to node 424. The timing transistors 416 and 418 further operate to pass the selected input bit to the output node 424 based upon the clock signals 217 and 219. TABLE 2 below provides the relative outputs based upon the value of the input data bit (D1) 110A and the state of the two mode signals 330 and 332, assuming that timing transistors 416 and 418 are turned "on."

TABLE 2

EXAMPLE VALUES FOR OPERATION
OF EMBODIMENT 400

| TEN 332 | TEI 330 | D1 | Node 420 | Node 422 | Node 424 |
|---|---|---|---|---|---|
| 1 | 0 | 1 | NA | 0 | 0 |
| 1 | 0 | 0 | 1 | NA | 1 |
| 0 | 1 | 1 | TIN | TIN | TIN |
| 0 | 1 | 0 | TIN | TIN | TIN |

As shown in TABLE 2, the scan mode is selected when the TEN signal 332 is low (e.g., logic "0") and the TEI signal 330 is high (e.g., logic "1"), and in this mode the input scan bit (TIN) 112 is passed to the output node 424. The data mode is selected when the TEN signal 332 is high (e.g., logic "1") and the TEI signal 330 is low (e.g., logic "0"), and in this mode an inverted version of the input data bit (D1) 110A is passed to the output node 424.

Figure 5:
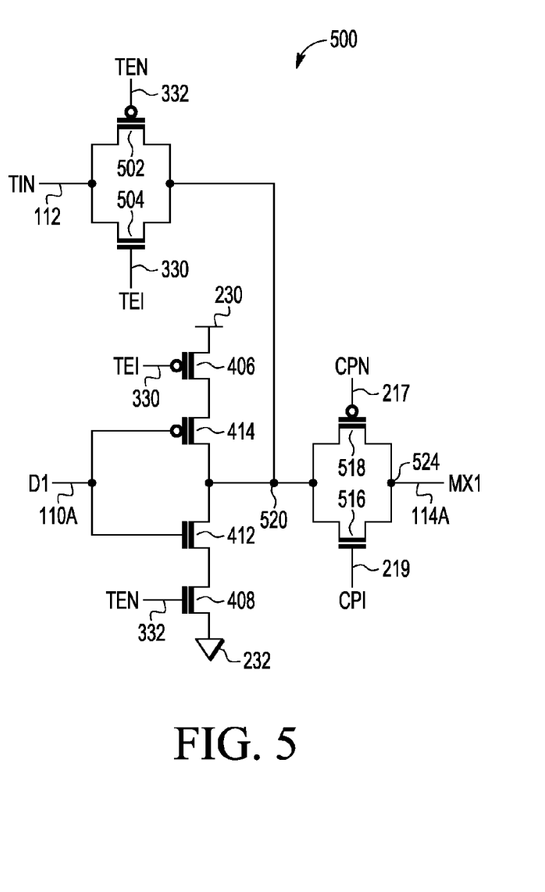
FIG. 5 is a circuit diagram of an example embodiment for the input multiplexers with pass gates placed in different locations as compared to the embodiment of FIG. 4.

FIG. 5 is a circuit diagram of an example embodiment 500 for input multiplexer 102A with pass gates placed in different locations as compared to the embodiment 400 of FIG. 4. The drain and source of PMOS transistor 414 are connected between node 520 and the voltage supply 230 through the drain and source of transistor 406, which receives the TEI signal 330 at its gate. The drain and source of NMOS transistor 412 are connected between node 520 and ground 232 through the drain and source of transistor 408, which receives the TEN signal 332 at its gate. The input data bit (D1) 110A is connected to the gates of transistors 412 and 414. The input scan bit (TIN) 112 is connected to node 520 through the source and drain of PMOS transistor 502, which receives the TEN signal 332 at its gate, and through the source and drain of NMOS transistor 504, which receives the TEI signal 330 at its gate. Node 520 is connected to node 524 through the drain and source of PMOS transistor 518, which receives the CPI signal 219 at its gate, and through the drain and source of NMOS transistor 516, which receives the CPN signal 217 at its gate. Node 524 provides the multiplexer output (MX1) 114A. When embodiment 500 is used for the input multiplexers in additional bit stages 252 or the last bit stage 254, the input scan bit (TIN) 112 becomes one of the propagated input scan bits 118 as shown in FIGS. 1 and 2.

Similar to the operation of embodiment 400 in FIG. 4, the mode signals 330/332 in embodiment 500 control transistors 502, 504, 406, and 408 to select between the input scan bit (TIN) 112 and an inverted version of the input data bit (D1) 110A to provide as an output to node 524. The timing transistors 516 and 518 further operate to pass the selected input bit to the output node 524 based upon the clock signals 217 and 219. TABLE 3 below provides the relative outputs based upon the value of the input data bit (D1) 110A and the state of the two mode signals 330 and 332, assuming that timing transistors 516 and 518 are turned "on."

TABLE 3

EXAMPLE VALUES FOR OPERATION OF EMBODIMENT 500

| TEN 332 | TEI 330 | D1 | Node 520 | Node 524 |
|---------|---------|----|----------|----------|
| 1 | 0 | 1 | 0 | 0 |
| 1 | 0 | 0 | 1 | 1 |
| 0 | 1 | 1 | TIN | TIN |
| 0 | 1 | 0 | TIN | TIN |

As shown in TABLE 3, scan mode is selected when the TEN signal 332 is low (e.g., logic "0") and the TEI signal 330 is high (e.g., logic "1"), and in this mode the input scan bit (TIN) 112 is passed to the output node 524. The data mode is selected when the TEN signal 332 is high (e.g., logic "1") and the TEI signal 330 is low (e.g., logic "0"), and in this mode an inverted version of the input data bit (D1) 110A is passed to the output node 524.

Figure 6:
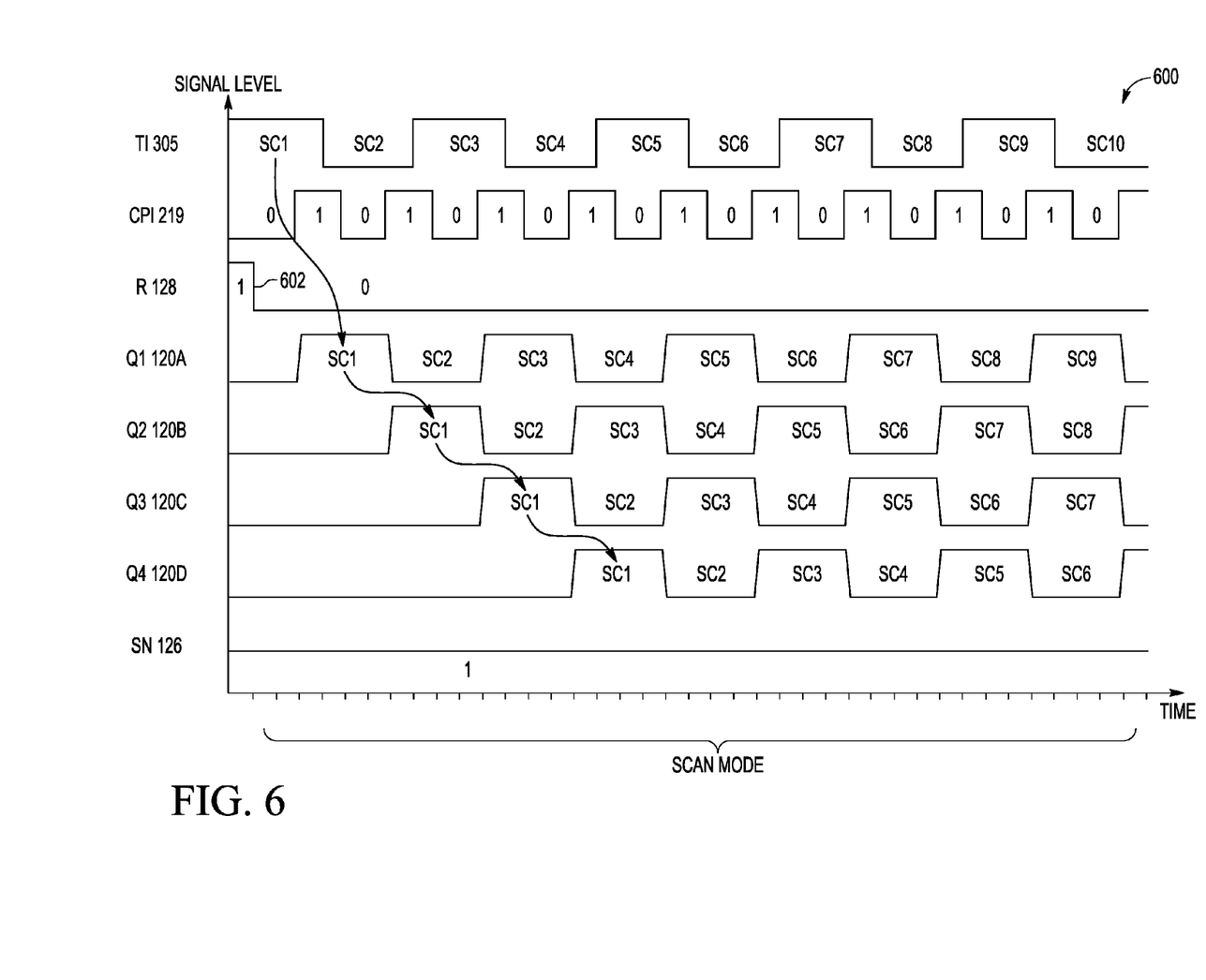
FIG. 6 is a timing diagram of an embodiment for propagation of input scan bits when the four-bit data flip-flop is placed into a normal scan mode of operation.

FIG. 6 is a timing diagram of an embodiment 600 for propagation of input scan bit (TIN) 112 when the four-bit data flip-flop 200 is placed into scan mode without being in an initialization mode. The timing diagram shows the signal levels for the input scan bit (TIN) 112, the clock signal (CPI) 219, the reset (R) signal 128, the first output data bit (Q1) 120A, the second output data bit (Q2) 120B, the third output data bit (Q3) 120C, the fourth output data bit (Q4) 120D, and the set (SN) signal 126. For embodiment 600, the set (SN) signal 126 remains at a high logic level (e.g., logic "1"), and the reset (R) signal 128 transitions to a low logic level (e.g., logic "0") at transition 602. This transition 602 starts the conventional scan mode, and the scan input bit (TIN) 112 then changes logic levels for each clock cycle of the clock signal (CPI) 219.

The first input scan bit value (SC1) is received by the first multiplexer 102A and propagates through the first master latch 104A and the first slave latch 106A to be provided as the first output data bit (Q1) 120A. Because the first slave latch 106A provides the propagated scan input bit 118A to the second input multiplexer 102B, the first input scan bit value (SC1) is received by the second multiplexer 102B and propagates through the second master latch 104B and the second slave latch 106B to be provided as the second output data bit (Q2) 120B. Because the second slave latch 106B provides the propagated scan input bit 118B to the third input multiplexer 102C, the first input scan bit value (SC1) is received by the third multiplexer 102C and propagates through the third master latch 104C and the third slave latch 106C to be provided as the third output data bit (Q3) 120C. Because the third slave latch 106C provides the propagated scan input bit 118C to the fourth input multiplexer 102D, the first input scan bit value (SC1) is received by the fourth multiplexer 102D and propagates through the fourth master latch 104D and the fourth slave latch 106D to be provided as the fourth output data bit (Q4) 120D. This process continues for each of the additional scan bits SC2 through SC10 shown in embodiment 600 until the scan mode is disabled when the data mode is selected.

Figure 7:
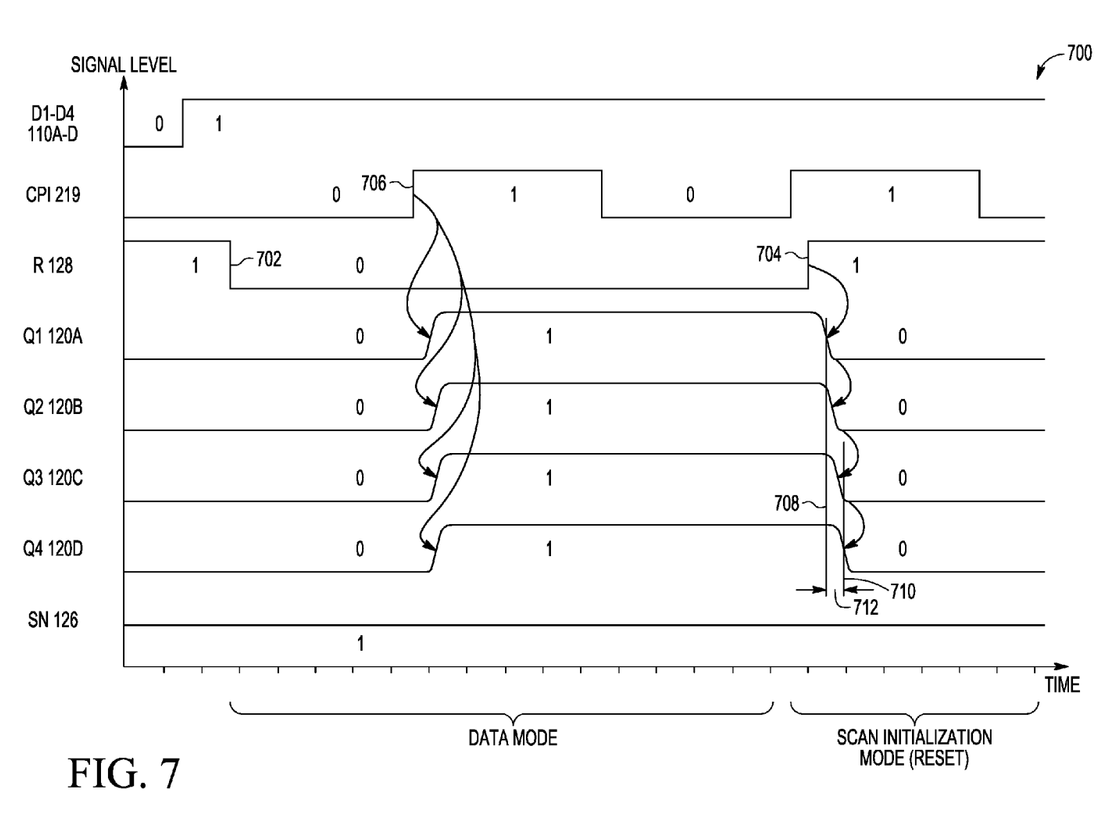
FIG. 7 is a timing diagram of an embodiment where the four-bit data flip-flop is placed into a reset initialization mode of operation to initialize bits stages to a first logic level.

FIG. 7 is a timing diagram of an embodiment 700 where the four-bit data flip-flop is placed into a reset initialization mode of operation to initialize bits stages to a first logic level. Initially, embodiment 700 shows latching of input data bits (D1-D4) 110A-D, which have transitioned from low to high logic level, in a data mode. The reset signal (R) 128 becomes inactive at transition 702. When the clock signal (CPI) 219 transitions to a high logic level at transition 706 the output data bits (Q1-Q4) 120A-D are latched to high logic levels. When the reset signal (R) 128 become active at transition 704, a reset scan initialization mode is started. This reset scan initialization mode causes the output data bits (Q1-Q4) 120A-D to all be forced to low logic levels as the input scan bit (TIN) 112 propagates through the multiplexers 102 and master/slave latches 104/106 as they are insensitive to external clock and data input signals. As shown in embodiment 700, the time delay from the first output transition 708 to the last output transition 710 is a relatively short propagation delay 712.

Figure 8:
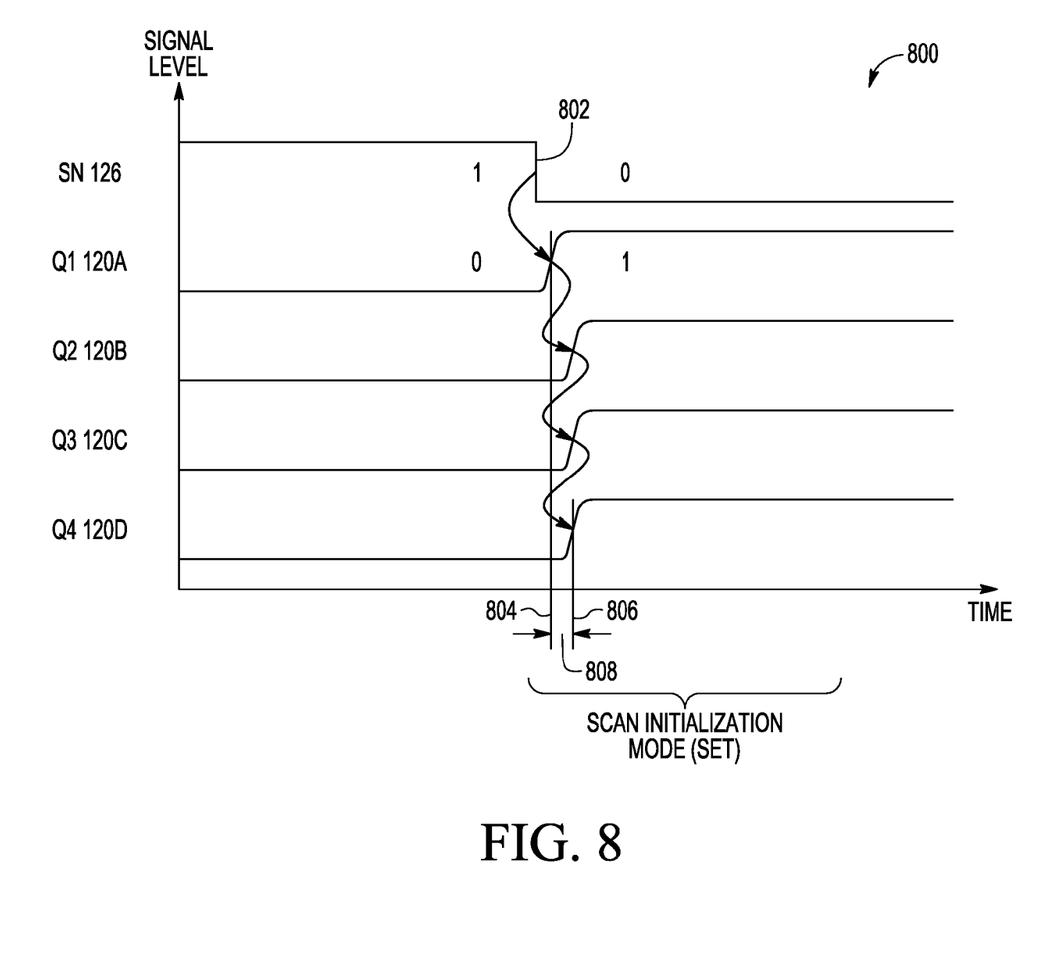
FIG. 8 is a timing diagram of an embodiment where the four-bit data flip-flop is placed into a set initialization mode of operation to initialize bits stages to a second logic level.

FIG. 8 is a timing diagram of an embodiment 800 where the four-bit data flip-flop is placed into a set initialization mode of operation to initialize bits stages to a second logic level. Assuming the reset signal (R) 128 is inactive when the set signal (SN) 126 become active at transition 802, a set scan initialization mode is started. This set scan initialization mode causes the output data bits (Q1-Q4) 120A-D to all be forced to high logic levels as the input scan bit (TIN) 112 propagates through the multiplexers 102 and master/slave latches 104/106 as they are insensitive external to clock and data input signals. As shown in embodiment 800, the time delay from the first output transition 804 to the last output transition 806 is a relatively short propagation delay 808.

Figure 9:
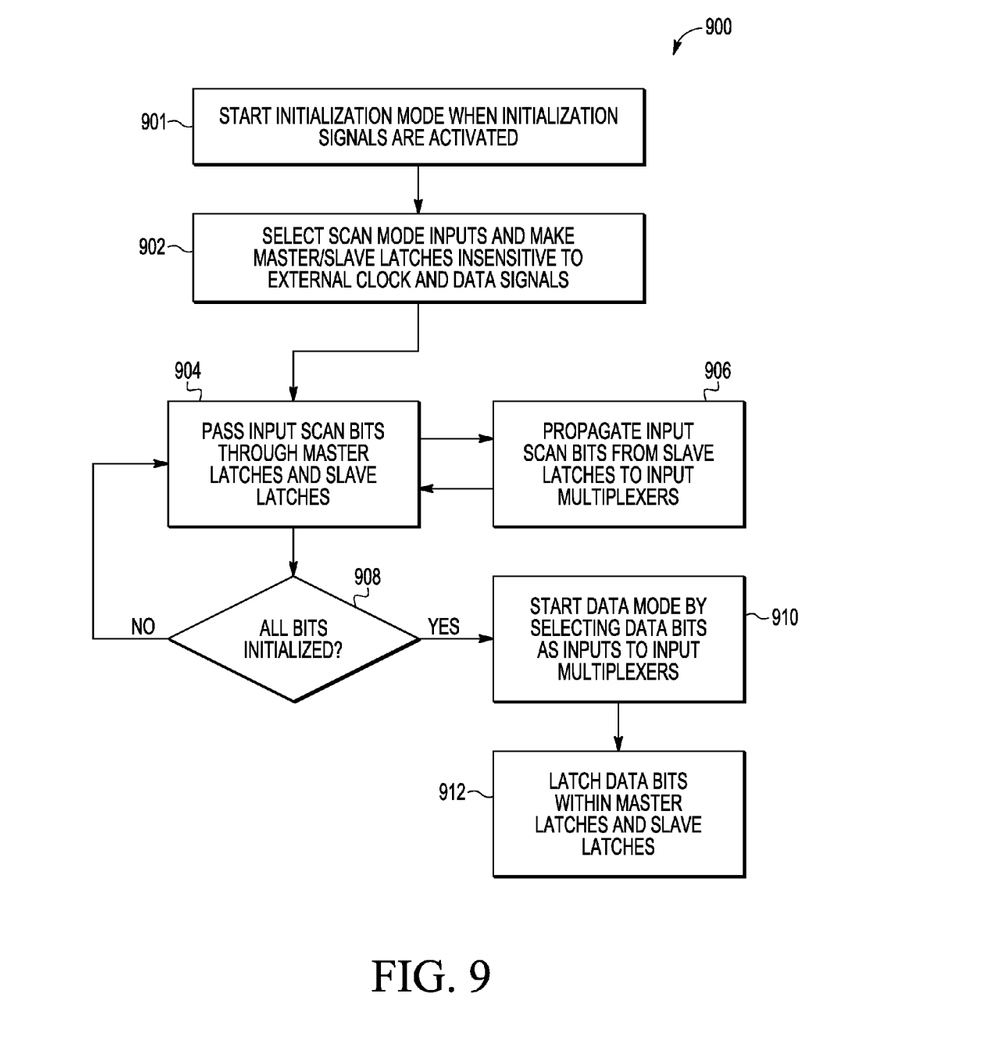
FIG. 9 is a process flow diagram of an example embodiment to initialize a multi-bit data flip-flop by propagation of input scan bits through the bit stages of the multi-bit data flip-flop.

FIG. 9 is a process flow diagram of an example embodiment 900 to initialize a multi-bit data flip-flop by propagation of input scan bits through the bit stages of the multi-bit data flip-flop. In block 902, an initialization mode of operation is started when one or more initialization signals 130 are activated. In block 902, the scan mode inputs are selected, and master/slave latches 104/106 are made to be insensitive to external clock signals, such as clock signal (CLK) 325, and external data signals, such as scan data 305 and input data bits 110. In block 904, the input scan bits are pass through the master latches 104 and the slave latches 106. As represented by block 906, input scant bits 118 are propagated by the slave latches 106 to the input multiplexers 102 as input scan bits are passed through the bit stages. In block 908, a determination is made whether all bits for the bit stages have been initialized. If "NO," then flow passes back to block 904. If "YES," then flow passes to block 910. In block 910, a data mode of operation is started by selecting data bits 110 as inputs for the input multiplexers 102. In block 912, data bits are latched within the master latches 104 and the slave latches 102, and these data bits are not propagated by the slave latches 106 to the input multiplexers 102. It is noted that additional and/or different process steps could also be utilized while still taking advantage of the scan initialization techniques described herein.

As described herein, a variety of embodiments can be implemented and different features and variations can be implemented, as desired.

For one embodiment, a multi-bit data flip-flop is disclosed including input multiplexers, master latches, and slave latches. The input multiplexers are coupled to receive mode select signals and are configured to select between input data bits for a data mode of operation and input scan bits for a scan mode of operation based upon the mode select signals. The master latches are coupled to receive and latch outputs from the input multiplexers for the data mode of operation and for the scan mode of operation. The slave latches are coupled to receive and latch outputs from the master latches for the data mode of operation and for the scan mode of operation, and the slave latches are further coupled to provide propagated input scan bits to the input multiplexers for the scan mode of operation. The input multiplexers, master latches, and slave latches are further configured to operate in an initialization mode of operation, based upon activation of one or more initialization signals, to propagate a fixed input scan bit through the multi-bit data flip-flop to initialize output bits for the multi-bit flip-flop to a common logic state.

In additional embodiments, the multi-bit data flip-flop further includes control circuitry configured to receive the one or more initialization signals and input scan data and to output the mode select signals and the fixed input scan bit to the input multiplexers, and the control circuitry includes a plurality of cascaded logic gates. In further embodiments, the control circuitry is further configured to receive external clock signals and to provide internal clock signals to the input multiplexers, the master latches, and the slave latches during the scan mode of operation and the data mode of operation. In still further embodiments, the control circuitry is further configured, in the initialization mode of operation, to cause the input multiplexers, the master latches, and the slave latches to be insensitive to the external clock signals.

In additional embodiments, the one or more initialization signals includes a set signal to initialize bits for the multi-bit data flip-flop to a first logic level and a reset signal to initialize bits for the multi-bit data flip-flop to a second logic level.

In additional embodiments, the input multiplexers, master latches, and slave latches are configured to provide a plurality of bit stages. In further embodiments, the master latches and the slave latches are coupled to receive clock signals, and the clock signals are configured to cause the master latches and the slave latches to latch logic levels during the data mode of operation and the scan mode of operation. In still further embodiments, the input multiplexers include input pass gates coupled between the input scan bits and output nodes for the input multiplexers. In additional embodiments, the input pass gates are coupled to be controlled by the mode select signals. In further embodiments, the input multiplexers further include output pass gates coupled between inverters within the input multiplexers and outputs for the input multiplexers, the output pass gates being controlled by clock signals.

For one embodiment, a method to initialize a multi-bit data flip-flop is disclosed including providing input multiplexers for the multi-bit flip-flop having input data bits and input scan bits where the input multiplexers are coupled to master latches and slave latches for the multi-bit data flip-flop. For a data mode of operation, the method also includes starting the data mode of operation by applying a first state for mode select signals to the input multiplexers to select the input data bits as inputs to the input multiplexers and latching input data bits within the master latches and the slave latches. For an initialization mode of operation, the method also includes starting the initialization mode of operation after activation of one or more initialization signals, setting the mode select signals to a second state to select the input scan bits as inputs to the input multiplexers, and propagating a fixed input scan bit through the multi-bit data flip-flop to initialize output bits for the multi-bit flip-flop to a common logic state.

In additional embodiments, the method further includes, for a scan mode of operation, starting the scan mode of operation by applying the second state for the mode select signals to the input multiplexers to select the input scan bits as inputs to the input multiplexers, propagating input scan bits through the master latches and the slave latches while propagating input scan bits from the slave latches to the input multiplexers, and latching the input scan bits within the master latches and the slave latches.

In additional embodiments, the method also includes receiving external clock signals and providing internal clock signals to the input multiplexers, the master latches, and the slave latches during the data mode of operation. In further embodiments, the method also includes, in the initialization mode of operation, causing the input multiplexers, the master latches, and the slave latches to be insensitive to the external clock signals.

In additional embodiments, the one or more initialization signals includes a set signal and a reset signal, and the method further includes initializing bits of the multi-bit data flip-flop to a first logic level when the set signal is activated and initializing bits of the multi-bit data flip-flop to a second logic level when the reset signal is activated.

In additional embodiments, the input multiplexers, master latches, and slave latches are configured to provide a plurality of bit stages. In further embodiments, the method also includes applying clock signals to the master latches and the slave latches to cause the master latches and the slave latches to latch logic levels. In still further embodiments, the input multiplexers include input pass gates coupled between the input scan bits and output nodes for the input multiplexers. In additional embodiments, the method includes controlling the input pass gates within the input multiplexers using the mode select signals. In further embodiments, the method includes controlling output pass gates within the input multiplexers coupled between inverters within the input multiplexers and outputs for the input multiplexers using clock signals.

It is noted that the functional blocks, devices, and/or circuitry described herein can be implemented using hardware, software, or a combination of hardware and software. In addition, one or more processing devices executing software and/or firmware instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer readable mediums (e.g., data storage devices, flash memory, random access memory, read only memory, programmable memory devices, reprogrammable storage devices, hard drives, floppy disks, DVDs, CD-ROMs, and/or any other tangible storage medium) and that are executed by one or more central processing units (CPUs), controllers, microcontrollers, microprocessors, hardware accelerators, processors, and/or other processing devices to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A multi-bit data flip-flop, comprising:
   input multiplexers coupled to receive mode select signals and configured to select between input data bits for a data mode of operation and input scan bits for a scan mode of operation based upon the mode select signals;
   master latches coupled to receive and latch outputs from the input multiplexers for the data mode of operation and for the scan mode of operation; and
   slave latches coupled to receive and latch outputs from the master latches for the data mode of operation and for the scan mode of operation, the slave latches being further coupled to provide propagated input scan bits to the input multiplexers for the scan mode of operation; and
   wherein the input multiplexers, master latches, and slave latches are further configured to operate in an initialization mode of operation, based upon activation of one or more initialization signals, to propagate a fixed input scan bit through the multi-bit data flip-flop to initialize output bits for the multi-bit flip-flop to a common logic state;
   control circuitry configured to receive the one or more initialization signals and input scan data and to output the mode select signals and the fixed input scan bit to the input multiplexers, wherein the control circuitry is further configured to receive external clock signals and to provide internal clock signals to the input multiplexers, the master latches, and the slave latches during the scan mode of operation and the data mode of operation, wherein the control circuitry is further configured, in the initialization mode of operation, to cause the input multiplexers, the master latches, and the slave latches to be insensitive to the external clock signals.

2. The multi-bit data flip-flop of claim 1, wherein the control circuitry comprises a plurality of cascaded logic gates.

3. The multi-bit data flip-flop of claim 1, wherein the one or more initialization signals comprises a set signal to initialize bits for the multi-bit data flip-flop to a first logic level and a reset signal to initialize bits for the multi-bit data flip-flop to a second logic level.

4. The multi-bit data flip-flop of claim 1, wherein the input multiplexers, master latches, and slave latches are configured to provide a plurality of bit stages.

5. The multi-bit data flip-flop of claim 4, wherein the master latches and the slave latches are coupled to receive clock signals, the clock signals being configured to cause the master latches and the slave latches to latch logic levels during the data mode of operation and the scan mode of operation.

6. The multi-bit data flip-flop of claim 4, wherein the input multiplexers comprise input pass gates coupled between the input scan bits and output nodes for the input multiplexers.

7. The multi-bit data flip-flop of claim 6, wherein the input pass gates are coupled to be controlled by the mode select signals.

8. The multi-bit data flip-flop of claim 6, wherein the input multiplexers further comprise output pass gates coupled between inverters within the input multiplexers and outputs for the input multiplexers, the output pass gates being controlled by clock signals.

9. A method to initialize a multi-bit data flip-flop, comprising
   providing input multiplexers for the multi-bit flip-flop having input data bits and input scan bits, the input multiplexers being coupled to master latches and slave latches for the multi-bit data flip-flop;
   for a data mode of operation:
      starting the data mode of operation by applying a first state for mode select signals to the input multiplexers to select the input data bits as inputs to the input multiplexers; and
      latching input data bits within the master latches and the slave latches; and
   for an initialization mode of operation:
      starting the initialization mode of operation after activation of one or more initialization signals;
      setting the mode select signals to a second state to select the input scan bits as inputs to the input multiplexers; and
      propagating a fixed input scan bit through the multi-bit data flip-flop to initialize output bits for the multi-bit flip-flop to a common logic state;
   receiving external clock signals and providing internal clock signals to the input multiplexers, the master latches, and the slave latches during the data mode of operation;
   in the initialization mode of operation, causing the input multiplexers, the master latches, and the slave latches to be insensitive to the external clock signals.

10. The method of claim 9, further comprising, for a scan mode of operation:
    starting the scan mode of operation by applying the second state for the mode select signals to the input multiplexers to select the input scan bits as inputs to the input multiplexers;
    propagating input scan bits through the master latches and the slave latches while propagating input scan bits from the slave latches to the input multiplexers; and
    latching the input scan bits within the master latches and the slave latches.

11. The method of claim 9, wherein the one or more initialization signals comprises a set signal and a reset signal, and further comprising initializing bits of the multi-bit data flip-flop to a first logic level when the set signal is activated and initializing bits of the multi-bit data flip-flop to a second logic level when the reset signal is activated.

12. The method of claim 9, wherein the input multiplexers, master latches, and slave latches are configured to provide a plurality of bit stages.

13. The method of claim 12, further comprising applying clock signals to the master latches and the slave latches to cause the master latches and the slave latches to latch logic levels.

14. The method of claim 12, wherein the input multiplexers comprise input pass gates coupled between the input scan bits and output nodes for the input multiplexers.

15. The method of claim 14, further comprising controlling the input pass gates within the input multiplexers using the mode select signals.

16. The method of claim 14, further comprising controlling output pass gates within the input multiplexers coupled between inverters within the input multiplexers and outputs for the input multiplexers using clock signals.

17. A multi-bit data flip-flop, comprising:

input multiplexers coupled to receive mode select signals and configured to select between input data bits for a data mode of operation and input scan bits for a scan mode of operation based upon the mode select signals;

master latches coupled to receive and latch outputs from the input multiplexers for the data mode of operation and for the scan mode of operation; and slave latches coupled to receive and latch outputs from the master latches for the data mode of operation and for the scan mode of operation, the slave latches being further coupled to provide propagated input scan bits to the input multiplexers for the scan mode of operation; and wherein the input multiplexers, master latches, and slave latches are further configured to operate in an initialization mode of operation, based upon activation of one or more initialization signals, to propagate a fixed input scan bit through the multi-bit data flip-flop to initialize output bits for the multi-bit flip-flop to a common logic state;

wherein the input multiplexers, the master latches, and slave latches implement a plurality of bit stages with each bit stage including an input multiplexer, a master latch, and a slave latch, wherein the plurality of bit stages are configured to sequentially propagate a scan bit through each of the bit stages of the plurality in a sequence from one bit stage to another;

wherein during a scan mode that is not an initialization mode, a scan bit is prorogated through each of the plurality of bit stages in the sequence from one bit stage to another by a clock signal changing clock states for a plurality of clock cycles;

wherein during an initialization mode, a scan bit is propagated through each of the plurality of bit stages in the sequence from one bit stage to another while the clock signal is continuously at a single logic state.

* * * * *